United States Patent [19]

Drain et al.

[11] Patent Number: 5,057,348
[45] Date of Patent: Oct. 15, 1991

[54] POTTED ELECTRICAL/MECHANICAL DEVICES, AND DUAL CURE POTTING METHOD

[75] Inventors: Kieran F. Drain, Rochester Hills, Mich.; Larry A. Nativi, Rocky Hill, Conn.

[73] Assignee: Loctite Corporation, Hartford, Conn.

[21] Appl. No.: 558,273

[22] Filed: Jul. 25, 1990

Related U.S. Application Data

[60] Division of Ser. No. 104,885, Aug. 19, 1987, Pat. No. 4,952,342, which is a continuation-in-part of Ser. No. 882,670, Jul. 7, 1986, which is a continuation-in-part of Ser. No. 801,984, Nov. 26, 1985.

[51] Int. Cl.$^5$ .............................................. B32B 9/00
[52] U.S. Cl. ..................................... 428/76; 428/209; 428/220; 428/411.1; 428/413; 428/423.1; 428/457; 428/461; 428/480; 428/901; 428/913; 174/52.2
[58] Field of Search ........................ 174/52.2; 361/414; 428/76, 209, 220, 411.1, 413, 423.1, 457, 461, 480, 901, 913

[56] References Cited

U.S. PATENT DOCUMENTS

| | | | |
|---|---|---|---|
| 2,683,767 | 7/1954 | Cunningham | 174/52 |
| 3,246,054 | 4/1966 | Guenther et al. | 264/22 |
| 3,383,565 | 5/1968 | Gritton | 317/101 |
| 3,622,419 | 11/1971 | London et al. | 156/242 |
| 3,670,091 | 6/1972 | Frantz et al. | 174/52 |
| 3,699,200 | 10/1972 | Tokarz et al. | 264/102 |
| 3,804,735 | 4/1974 | Radlove et al. | 204/159.23 |
| 3,847,770 | 11/1970 | Radlowe et al. | 204/156.23 |
| 3,935,330 | 1/1976 | Smith et al. | 427/41 |
| 3,989,610 | 11/1976 | Tsukada et al. | 204/156.15 |
| 4,025,407 | 5/1977 | Chang et al. | 204/159.14 |
| 4,073,835 | 2/1978 | Otsuki et al. | 264/22 |
| 4,239,077 | 12/1980 | Dickson et al. | 156/272 |
| 4,330,929 | 5/1982 | Cripe | 29/570 |
| 4,427,478 | 1/1984 | Grant et al. | 156/275.5 |
| 4,479,990 | 10/1984 | Dickson et al. | 428/36 |
| 4,540,533 | 9/1985 | Sahakian et al. | 264/1.4 |
| 4,552,604 | 11/1985 | Green | 156/246 |
| 4,607,469 | 8/1986 | Harrison | 52/220 |
| 4,849,048 | 7/1989 | Inagaki | |
| 4,892,764 | 1/1990 | Drain et al. | 428/34.5 |
| 4,952,342 | 8/1990 | Drain et al. | 264/22 |

*Primary Examiner*—Patrick J. Ryan
*Attorney, Agent, or Firm*—Steven J. Hultquist

[57] ABSTRACT

A device e.g., an electrical or electromechanical assembly (62), comprising a housing (64) with a mechanism (66) disposed therein which is potted by a cured mass of self-leveling liquid composition. The composition comprises an actinic radiation cured first resin component (102) preferably (methacrylate resins, which immobilize the partially cured mass, and a subsequently cured second resin component (100), preferably epoxy resins, which is non-cured under the actinic radiation but curable at ambient or elevated temperature. Depending on the depth of the composition which is to be cured in the housing, it may be desirable to utilize the self-leveling liquid composition as either a single homogeneous mixture of the first and second resin components, or, where the depth of the housing is greater than the depth of UV penetration, as cured mass wherein the first resin component is in a separate and discrete resin layer overlying a lower resin layer containing the second resin component but not the first resin component.

38 Claims, 3 Drawing Sheets

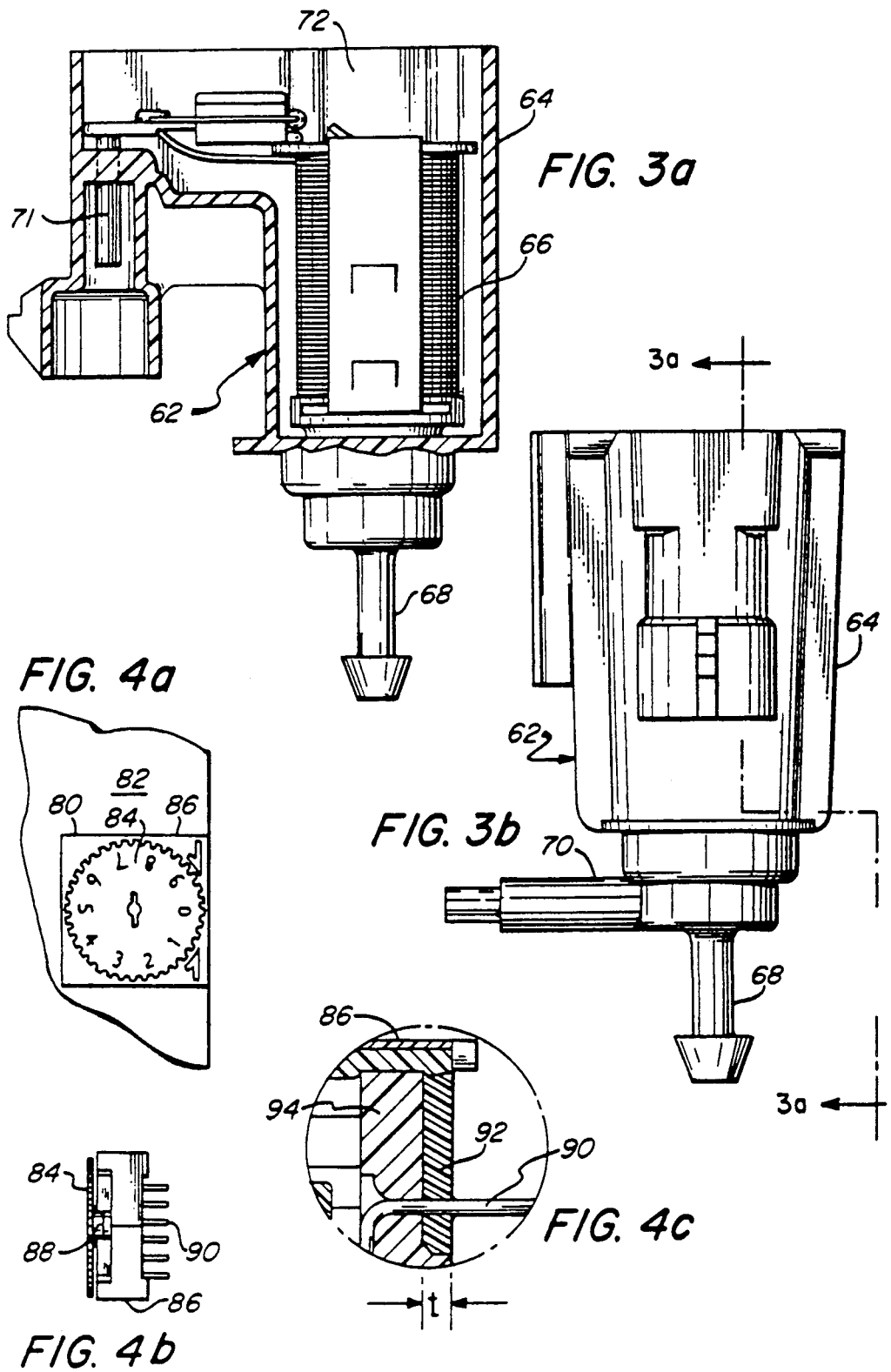

POTTED ELECTRICAL/MECHANICAL DEVICES, AND DUAL CURE POTTING METHOD

CROSS-REFERENCE TO RELATED APPLICATIONS

This is a division of U.S. application No. 07/104,885 filed Aug. 19, 1987 (corresponding to and based on International Patent Application PCT/US87/01593 filed July 2, 1987) issued Aug. 28, 1990 as U.S. Pat. No. 4,952,342, which in turn is a continuation-in-part of U.S. applicaation No. 882,670 filed July 7, 1986, which in turn is a continuation-in-part of U.S. application No. 801,984 filed Nov. 26, 1985.

DESCRIPTION

1. Technical Field

This invention relates to electrical/mechanical devices of the type comprising a housing in which a mechanism is potted by a cured resinous mass, and to a method of making such devices.

2. Background Art

In the manufacture of electrical/mechanical devices wherein a mechanism is disposed in a housing and potted with a cured mass of a resinous composition to provide a barrier between the mechanism and the external environment of the device, a number of curable compositions have been employed.

For example, Japanese patent application 57/134,923 discloses the manufacture of an electrolytic capacitor in which the capacitor element is positioned in an aluminum case and sealed with rubber prior to potting of the assembly with an epoxy or phenolic resin.

West German Offenlegungsschrift 2,649,070 teaches the encapsulation of polystyrene capacitors with a thermosetting epoxy in a mold at elevated temperature.

Thermosetting epoxy resins have come into broad usage in such potting applications due to their favorable properties, including high strength, hardness, solvent resistance, good adhesion to conventionally employed housing materials, thermal stability, gas impermeability, and ready curability by a variety of mechanisms and numerous curatives over a wide range of elevated temperature cure conditions.

Despite their significant advantages, however, thermosetting epoxy resins have associated disadvantages which have limited their use, or otherwise rendered their employment in the aforementioned potting applications difficult in the context of commercial high volume manufacturing operations.

A primary disadvantage of thermosetting epoxy resins in the potting of electrical/mechanical assemblies is that their viscosities decrease with increasing temperature under curing conditions until the onset of gellation is reached.

Thus, as the resinous mass dispensed into the housing of the device is subjected to elevated temperature, e.g., on the order of 150–400 degrees F., as in a cure oven, the viscosity of the epoxy resin progressively decreases. The positional stability of the resinous mass then is lost and it migrates or "runs" within the housing.

Such migratory behavior is deleterious due to its tendency two foul the mechanism in the housing. When the mechanism is mechanical or electromechanical in character, and thus includes moving parts, the fouling may interfere with or prevent the proper operation of the mechanism, rendering it useless for its intended purpose. When the mechanism is electrical in character, the fouling may change the conductivity, capacitance, resistance or other critical characteristics of the mechanism's components, ruining the device and requiring its rejection in the manufacturing operation.

Another significant disadvantage of the use of thermosetting epoxy resins in the potting of electrical/mechanical devices is associated with air or other ambient gas which is trapped around the mechanism when the resin is dispensed into the housing, particularly when the mechanism contains voids from which the ambient gas is not readily displaced when the liquid resin is introduced.

The trapped gas in the housing during the curing of the epoxy resin then may bubble through the curing mass, particularly since its viscosity is reduced at this stage, and produce gas channeling void formation in the finally cured composition mass. Frequently, this gas bubbling effect is extensive enough to create continuous leak path channels in the finally cured mass, with the result that the intended barrier function of the cured mass is defeated.

The gas bubbling effect is also present when ambient cure epoxy resins are employed, although to a lesser extent.

In some electrical/mechanical devices, the mechanism is interiorly disposed in the housing and the housing is provided with an opening through which a structural element is inserted and joined to the interior mechanism after the latter has been potted and the resinous mass fully cured. An example is a trimming potentiometer, wherein the lead screw or gear shaft is inserted into the housing to engage a wiper assembly whereby input voltage to the device may be divided as a function of the mechanical input.

In such devices the housing opening usefully serves as a "blow hole" accomodating the release of gas during he curing of the potting mass. The opening, however, also provides a flow path which may aid the migratory fouling of the interior machanism as well migratory occlusion of the opening itself.

Relative to the resin compositions of the present invention which overcome the aforementioned problems, relevant art includes U.S. Pat. No. 4,412,048; Australian Patent Application 53,233/79; U.S. Pat. No. 4,479,990; U.S. Pat. No. 4,239,077; U.S. Pat. No. 4,025,407; U.S. Pat. No. 4,552,604; U.S. Pat. No. 4,427,478; European Patent Application 9,856; and Japanese Patent Application 60/84,715, disclosing acrylic/epoxy resin compositions which are sequentially UV and thermally cured. Other related art includes U.S. Pat. No. 4,444,806 (co-heat cured acrylic/epoxy compositions); U.S. Pat. No. 4,548,895 (composition containing 1,2-epoxy compounds and acrylates which are first thermal cured, then photocured by actinic radiation exposure); and U.S. Pat. Nos. 4,288,527 and 4,352,723 (pinacol-containing acrylate compositions optionally with a copolymerizable monomer or reactive diluent, which "are cured by both ultraviolet radiation and heat, in either order or simultaneously to form solid products suitable for use as...sealants").

DISCLOSURE OF INVENTION

It is an objective of the present invention to provide an electrical/mechanical device of the type containing a mechanism in a housing which is potted with a resinous composition avoiding the migratory fouling/occlusion and gas channeling void formation problems of previously used potting compounds.

In one aspect, the present invention relates to a device comprising a housing containing a mechanism potted therein by a cured mass of a self-leveling liquid composition comprising an actinic radiation cured first resin component and a subsequently cured second resin component which is non-cured under actinic radiation conditions effective for curing the first resin component, the cured mass being free of (i) curingly caused migrative movement in the housing, and (ii) voids due to curingly caused gas channeling through the mass.

The absence of migrative movement of the potting mass and gas channeling through the mass during its cure is achieved by the proportions and cures of the first and second resin components being such that the actinic radiation curing of the first resin component:

(i) immobilizes the resulting partially cured mass of the composition throughout the subsequent curing of the second resin component, and (ii) renders the resulting partially cured mass of the composition impermeable to gas channeling void formation throughout the subsequent curing of the second resin component.

In another aspect, the invention relates to a device as described above, in which the actinic radiation cured first resin component is selected from the group consisting of: (a) (meth)acrylic resins, (b) vinyl monomers, (c) unsaturated polyesters, solubilized in vinyl monomers, and (d) epoxy resins.

A further aspect of the invention relates to a device as described above, in which the second resin component is cured under conditions selected from one or more compatible conditions of the group consisting of: (a) moisture exposure, (b) ambient temperature, (c) elevated temperature, (d) reaction with curative species, (e) in situ formation of curative species, and (f) actinic radiation exposure differing from the actinic radiation exposure which is curingly effective for the first resin component.

In another aspect of the invention relating to a device as broadly described above, the cured mass comprises the first resin component in a separate and discrete layer in the mass, with such first resin component-containing layer overlying a layer comprisng the second resin component but not the first resin component. This aspect of the invention is particularly advantageous when the depth of the housing to be filled with the potting resin mass is deeper than 120 mils, since it is generally difficult for actinic radiation to penetrate to a depth significantly beyond this level in resinous media. In this instance, the provision of the actinic radiation curable resin in an overlayer which is of a thickness not exceeding 120 mils permits ready actinic radiation cure resulting in immobilization (containment) of the underlying second resin component-containing layer prior to its curing.

Alternatively, the first and second resin components in the cured mass may be homogeneously mixed with one another prior to their introduction into the housing to form the potting mass.

Other aspects of the invention relating to a device as described above include:

the second resin component being selected from the group consisting of epoxy resins, silicones, and urethanes;

the thickness of the cured composition mass being greater than 40 mils and preferably greater than 60 mils;

the second resin component being an epoxy resin and the housing being formed of a material selected from the group consisting of polybutylene terephthalate and polyphenylene sulfone;

the second resin component being a cycloaliphatic epoxy resin which is cured with an acid anhydride curative; and the housing having an opening therein through which a structural element is extended and joined to the potted mechanism in the housing.

In another aspect, the invention relates to a method of potting a device including a mechanism in a housing, comprising:

(i) dispensing into the housing a self-leveling liquid composition comprising an actinic radiation curable first resin component and a second resin component which is non-curable under actinic radiation conditions effective for curing the first resin component;

(ii) exposing the composition to actinic radiation conditions curingly effective for the first resin component, with the proportions and cure conditions of the first and second resin components being such that the actinic radiation curing of the first resin component (A) immobilizes the resulting partially cured mass of the composition throughout the subsequent curing of the second resin component, and (B) renders the resulting partially cured mass of the composition impermeable to gas channeling void formation throughout the subsequent curing of the second resin component; and (iii) thereafter exposing the partially cured composition mass to conditions curingly effective for the second resin component.

Another aspect of the invention relates to a method as described above in which the second resin component is an epoxy resin which is cured at elevated temperature with a curative selected from the group consisting of amines, latent amines, acid anhydrides, dissociable amine salts, cationic catalysts, dicyandiamide, and compatible mixtures thereof.

A further aspect of the invention relates to a method as described above in which the housing has an opening therein through which a structural element is extended and joined to the potted mechanism after curing of the composition, and the viscosity and wetting properties of the self-leveling liquid composition dispensed into the housing prevent occlusion of the opening by the dispensed liquid composition until it is immobilized by actinic radiation curing of the first resin component.

In another aspect of the method of the invention as broadly described above, a first portion of the self-leveling liquid composition comprising the second resin component but not the first resin component is dispensed into the housing, followed by dispensing of a second portion of the self-leveling liquid composition comprising the first resin component, so that the respective dispensed first and second portions form separate and discrete layers in the housing. Alternatively, the self-leveling liquid composition dispensed into the housing may be a homogeneous mixture of the first and second resin components.

As used herein, the term "potting" in reference to an electrical/mechanical component refers to sealing of the component with a bulk mass, having a thickness of at least 5 mils, of a curable composition which has been appropriately cured.

The term "self-leveling liquid" used in reference to the potting composition employed in the invention means that the composition as initially dispensed into the housing of the device has viscosity and wetting characteristics which cause the composition mass to establish a substantially level free surface in the housing without the imposition of external force or work thereon.

The disclosures of U.S. Pat. application Ser. No. 801,984 filed Nov. 26, 1985 in the names of L. A. Nativi and P. L. Kropp, and U.S. Pat. application Ser. No. 882,670 filed July 7, 1986 in the names of K. F. Drain and L. A. Nativi, are hereby incorporated by reference herein.

The electrical/mechanical device of the invention may be any suitable device which is electrical/mechanical in character comprising a housing containing a mechanism which may usefully be potted by a resinous composition.

As used herein, the term "electrical/mechanical" is intended to be broadly construed to include electrical and/or mechanical devices, and in such context, "electrical" will be understood to refer to conventional electrical devices as well as to electronic devices.

Illustrative of the electrical/mechanical devices usefully employed in the broad practice of the invention are variable resistance-type potentiometers, capacitors, printed circuit board switches, solenoids, resistors, etc.

The potting composition utilized in the invention comprises an actinic radiation curable first resin component and a second resin component which is subsequently cured after actinic radiation exposure curing of the first resin component and thus is non-cured under actinic radiation conditions effective for curing the first resin component.

The first resin component may comprise any suitable resin which under actinic radiation conditions may be cured to such extent as to immobilize the resulting partially cured mass of the composition comprising the first and second resin components, i.e., spatially fix the location of the partially cured compositon mass so that it does not migrate during the subsequent cure of the second resin component, while simultaneously rendering the partially cured mass of the composition impermeable to gas channeling void formation during the subsequent cure of the second resin component.

Suitable first resin components of the composition may include (meth)acrylic resins, vinyl monomers, unsaturated polyesters solubilized in vinyl monomers, and epoxy resins.

As used herein, the term "(meth)acrylic" is intended to be broadly construed to include acrylic as well as methacrylic compounds, e.g., acrylic esters and methacrylic esters.

Useful acrylic resins include esters and amides of (meth)acrylic acid as well as comonomers thereof with other copolymerizable monomers. Illustrative esters include methyl acrylate, methyl methacrylate, hydroxy ethyl acrylate, butyl methacrylate, octyl acrylate, and 2-ethoxy ethyl acrylate. Illustrative amides include butoxymethyl acrylamide, methacrylamide, and tert-butyl acrylamide. Also suitable are copolymers of such compounds, and copolymers with other monomers containing polymerizable vinyl groups. Polyacrylates are generally useful, including 1,3-butylene glycol diacrylate, diethylene glycol diacrylate, 1,6-hexanediol diacrylate, neopentyl glycol diacrylate, polyethylene glycol diacrylate, tertaethylene glycol diacrylate, triethylene glycol diacrylate, pentaerythritol tetraacrylate, tripropylene glycol diacrylate, ethoxylated bisphenol-A-diacrylate, trimethylolpropane triacrylate, di-trimethylolpropane tetraacrylate, dipentaerythritol pentaacrylate, pentaerythritol triacrylate, and the corresponding methacrylate compounds. Also useful are reaction products of (meth)acrylic acid and epoxide resins, and urethane acrylic resins. Suitable poly(meth)acrylate ester compounds are also described in U.S. Pat. Nos. 4,051,195; 2,895,950; 3,218,305; and 3,425,988.

It will be understood that the foregoing listing of (meth)acrylic compounds is intended only to be illustrative in character, and that any other resin compounds having (meth)acrylic functionality in their molecules and curable under actinic radiation conditions may be potentially employed.

Among the foregoing compounds, (meth)acrylic acid esters are preferred, with the most preferred compounds being (meth)acrylic acid esters of polyhydric alcohols, such as ethoxylated trimethylolpropane triacrylate and dipentaerythritol monohydroxy pentaacrylate.

Another class of resins which are actinic radiation curable and potentially suitable for use in the compositions in the invention include vinyl monomers such as styrene, vinyl toluene, vinyl pyrrolidone, vinyl acetate, divinyl benzene, and the like.

A further class of actinic radiation curable first resin component materials comprises unsaturated polyesters, solubilized in vinyl monomers, as ordinarily prepared from alpha-beta ethylenically unsaturated polycarboxylic acids and polyhydric alcohols, as described for example in U.S. Pat. No. 4,025,407.

Yet another class of actinic radiation curable first resin component materials comprises UV curable epoxy resins, including cycloaliphatic epoxides such as limonene dioxide, limonene oxide, alpha pinene oxide, aliphatic epoxides such as butyl diglycidyl ether, and neopentyl glycol diglycidyl ether, as illustratively disclosed in U.S. Pat. No. 4,412,048.

As used herein, "actinic radiation" means electromagnetic radiation having a wavelength of about 700 nm or less which is capable, directly or indirectly, of curing the specified resin component of the potting composition. By indirect curing in this context is meant curing under such electromagnetic radiation conditions as initiated, promoted or otherwise mediated by another compound.

Although it is an essential requirement of the invention that the first resin component be actinic radiation curable, the second resin component may or may not be so curable, depending on the cure and resin composition desired; if both first and second resins are actinic radiation curable, however, it is further required that the second resin component be non-cured under actinic radiation conditions which are effective for curing the first resin component.

Accordingly, photoinitiators may be added to the composition in an amount effective to respond to the actinic radiation and to initiate and induce curing of the associated resin, via substantial polymerization thereof.

Suitable photoinitiators useful with ultraviolet (UV) actinic radiation curing of (meth)acrylic and vinyl monomers include free radical generating UV initiators such as benzophenone, diethoxy-acetophenone, benzoin methyl ether, benzoin ethyl ether, benxoin isopropyl ether, diethoxyxanthone, chloro-thio-xanthone, azo-bis-isobutyronitrile, N-methyl diethanol-amine-benzophenone, and mixtures thereof.

Visible light initiators include camphoroquinone/-peroxyester initiators and 9-fluorene carboxylic acid peroxyesters.

Infrared initiators include cumeme hydroperoxide, benzoyl peroxide, asobisisobutyronitrile, and like azo and peroxide compounds.

If the actinic radiation curable first resin component is an epoxy resin, the photoinitiator may be a UV initiator which in the presence of UV light, liberates a Lewis acid and/or Bronsted acid, such as iodonium salts, sulfonium salts, arsonium salts, and diazonium salts.

The amount of the photoinitiator required for a given composition may be readily determined by the expedient of simple experiment, without undue effort. In general, however, in the case of (meth)acrylic and vinyl first resin components, amounts of photoinitiator on the order of about 0.1–10 percent by weight, and preferably about 0.5–5 percent by weight, based on the weight of the resin component, have been found satisfactory. In the case of UV curable epoxies, the Lewis acid/Bronsted acid-releasing initiator may generally be present in the composition at a concentration of about 1–5 percent by weight, based on the weight of the epoxy resin.

The second resin component of the potting composition may be any suitable resin which is compatible with the composition comprising the first resin component and which, as indicated, is non-cured under the actinic radiation conditions which are curingly effective for the first resin component.

The second resin component thus may be curable under any suitable curing conditions, including, but not limited to, one or more compatible conditions of the group consisting of: (a) moisture exposure, (b) ambient temperature, (c) elevated temperature, (d) reaction with curative species, (e) in situ formation of curative species, and (f) actinic radiation exposure differing from the actinic radiation exposure which is curingly effective for the first resin component.

Illustrative of second resin component materials are epoxy resins, silicones, and urethanes.

Epoxy resins potentially suitable for use as the second resin component of the potting composition include those materials having at least one polymerizable epoxy group per molecule, and preferably two or more such groups per molecule. Suitable epoxy resins include those derived from epichlorohydrin and dihydric phenols, e.g., resorcinol, hydroquinone, bisphenol A, p-p'-dihydroxybenzophenone, p-p'-dihydroxydiphenyl, p-p'-dihydroxydiphenyl ethane, bis (2-hydroxynaphthyl) ethane, and 1,5-dihydroxynaphthalene, with bisphenol A being preferred. The epoxy compound may be a cycloaliphatic epoxy, an epoxidized novolak, or a diglycidyl ether of bisphenol A (DGEBA), as described in "Handbook of Epoxy Resins" by Lee and Neville, McGraw-Hill Book Co., New York (1967).

In lieu of the above-described epoxy functional polymerizable monomers, or alternatively in association therewith, various epoxidized rubbers may be utilized in the potting compositions of the invention as the second resin component, such materials being well known in the art.

A useful class of such epoxidized rubbers are epoxidized carboxy terminated butadiene acrylonitrile copolymers sold under the name of Kelpoxy by Spencer Kellogg, and epoxidized polybutadiene, for example Oxiron 2001 commercially available from FMC Corporation. Still other suitable rubber epoxy additives are the various polymers sold by B.F. Goodrich Company under the name HYCAR.

Epoxies are preferred second resin components in the potting compositions employed in the invention, for the reasons discussed herein in the "Background Art" section hereof. As there indicated, a wide variety of curatives and curing conditions may be employed to cure various epoxy resins.

Preferred epoxy resins useful as the second resin component in the invention are heat-cured epoxy resins. Accordingly, conventional heat-activated epoxy curatives, of a type well known in the art, may be employed. Such curatives are, for example, described in "Epoxy Resins, Chemistry and Technology," May and Tanaka, Marcel Dekker, Inc., New York (1973), hereby incorporated by reference, and may include:

(i) Lewis acid (cationic) catalysts, such as boron trifluoride amine complexes, e.g., boron trifluoride monoethyl amine, as well as the metal halides of tin, aluminum, zinc, boron, silicon, iron, titanium, magnesium, and antimony, and the like;

(ii) acid anhydrides, such as hexahydrophthalic anhydride, tetrahydrophthalic anhydride, nadic methyl anhydride, dodecenyl succinic anhydride, and the like;

(iii) imidazoles, such as derivatives of 2-phenyl imidazole, and derivatives of 1-cyanoethyl-2-phenylimidazole, and the like;

(iv) dicyanodiamide, optionally in combination with accelerators such as phenyl methyl urea or piperidine;

(v) latent amine curatives, such as the modified polyamide disclosed in U.S. Pat. No. 4,459,398 and available from Ciba Geigy as Hardener HT939;

(vi) amines per se, e.g., tertiary amines such as pyridine, 2,4,6-tris(dimethylaminoethyl)phenol, benzyldimethylamine, and triethylamine, and secondary amines such as piperidine, diethanolamine, and the like; and (vii) dissociable amine salts, such as the tri(2-ethylhexanoate) salt of tris(dimethylaminomethyl)phenol, and the like.

Another class of potential second resin component materials includes silicones such as RTV silicones, e.g., oxime polysiloxane materials. Such silicones may suitably be moisture cured in a conventional known manner.

A further class of potential second resin component materials includes polyurethane resins, including thermosetting as well as moisture curable polyurethane resins formed as condensation products of polyisocyanates and active hydrogen-containing compounds. The active hydrogen compounds may for example be polyesters prepared from polycarboxylic acids and polyhydric alcohols, polyhydric polyalkylene ethers having at least two hydroxy groups, polythioether glycols, polyester amides, etc.

The foregoing classes of potential second resin component materials are illustrative of character, it being understood that any other resin materials which are compatible with the potting composition comprising the first resin component and efficacious for the potting usage of the composition may advantageously be employed.

Other resins which may be usefully employed as second resin components, depending on the identity of the first resin component and the desired characteristics of the potting composition, include alkyd resins, acrylic resins, and aminoplast resins.

A highly useful second resin component which has been advantageously employed in potting compositions in accordance with the invention is a cycloaliphatic epoxy resin which is cured at elevated temperature in the presence of an acid anhydride curative. Such resins are preferred for electronic device applications of the present invention due to their purity, viz., their commerical availability in a form substantially free of impurities such as chloride ion, which can adversely effect electronic device performance at levels as low as 5 parts per million.

The specific relative proportions of the respective first and second resin components in the potting composition as necessary or appropriate for a given application may be readily determined by simple experiment to determine if the particular ratio chosen meets the potting compositon criteria of the invention, viz., the proportions and cures of the first and second resin components must be such that the actinic radiation curing of the first resin component:

(i) immobilizes the resulting partially cured mass of the composition througout the subsequent curing of the second resin, and (ii) renders the resulting partially cured mass of the composition impermeable to gas channeling void formation througout the subsequent curing of the second resin component.

These criteria may readily be assessed empirically by sample measurement, porosimetry tests, visual inspection, etc., without undue experimentation by one of ordinary skill in the art.

In the broad practice of the invention, the concentration of the first resin component may suitably be on the order of from about 1 to about 50 percent by weight, based on the total weight of the first and second resin components in the potting composition. If the first resin component is present at concentrations below about 1 percent, there is generally insufficient immobilization of the potting composition, so that it is susceptible to migration and permeable to void formation due to gas channeling, until the second resin component is cured. If, on the other hand, the concentration of the first resin component is above about 50 percent, there tends to be insufficient second resin component present to provide the desired ultimate physical and performance properties in the finally cured potting composition.

Based on the foregoing considerations, highly desirable potting compositions according to the invention may employ the first resin component at a concentration of from about 1 to about 30 percent by weight, based on the total weight of the first and second resin components in the composition.

Preferred concentrations of the first resin component in the potting composition, particularly when the first resin component is a (meth)acrylic resin and the second resin component is an epoxy resin, are from about 5 to about 20 percent by weight, most preferably from about 5 to about 10 percent by weight, based on the total weight of the first and second resin components.

The potting compositions of the invention may suitably contain any further components necessary or desirable for the specific intended end use and curing schedule. Examples include stabilizers, antioxidants, pigments, fillers, surfactants, tackifiers, adhesion promotors, etc.

In accordance with the invention, the device to be potted, comprising a mechanism in a housing, is appropriately positioned and the potting compositon is dispensed into the housing as a self-leveling liquid. Such self-leveling characteristic is provided by proper formulation of the composition to yield the necessary viscosity and wetting behavior therefor.

The dispensed potting composition then is sequentially subjected to the respective curing conditions of the first and second resin components, i.e., a first actinic radiation exposure which is curingly effective for the first resin component and a second cure exposure effective to cure the second resin component.

It will be appreciated that it may be desirable in some instances to deploy more than two resin components in the potting composition, each of which is in turn cured, and that such polymodal cure compositions are within the purview of the invention.

The thickness of the fully cured composition which is provided in the housing of the electrical/mechanical device after the cure of the respective resin components will depend on a number of variables, including the character of the composition, the nature of the mechanism to be protected, the intended end use environment, etc. In general, however, the thickness of the cured potting composition will preferably be greater than about 40 mils and most preferably greater than about 60 mils.

Potting compositions according to the invention may be formulated for effective performance for various housing materials (materials of construction for the device housing). In case of electrical and electromechanical devices, high strength, temperature resistant materials such as polybutylene terephthalate, commercially available under the trademark Valox, and polyphenylene sulfide, commercially available under the trademark Ryton, have come into wide usage. For these materials, potting compositions containing epoxy resins as the second resin components are preferred, due to the fact that suitable second resin epoxies will generally have a coefficient of thermal expansion which is close to the thermal expansion coefficients of these materials of construction.

The invention as broadly described hereinabove may be practiced in two distinct modes depending on the geometry and depth of the housing in which the cured potting mass of the invention is employed.

In a first mode of practicing the invention, the first and second resin components may be homogeneously mixed with one another in the self-leveling liquid composition which is dispensed into the housing and subsequently cured as previously described.

In this mode, the actinic radiation conditions effective for curing the first resin component produce a partial cure of the self-leveling liquid composition throughout the entire volume of the potting mass.

This first mode of practicing the invention is potentially useful in systems in which the depth of the potting mass in the housing is not greater than about 120 mils. The reason for this thickness limitation on the dimensional characteristics of the potting mass is that in resin compositions of the general type used in the invention, actinic radiation of a wavelength and intensity which is effective for curing the actinic radiation curable first resin component, typically does not generally penetrate into the resin mass beyond about 120 mils. Accordingly, at increased depths of the resin composition formed by homogenous mixing of the actinic radiation curable first resin component and the subsequently cured second resin component, the first resin component at the lower depths, below about 120 mils, remains uncured.

While this incomplete cure at lower depths may be tolerable in various applications, it is generally desirable to produce a substantially complete cure throughout the entire volume of the potting mass.

Accordingly, in systems where the depth of the potting mass is generally greater than about 120 mils, or where the potting mass is otherwise deployed so that the mechanism in the housing restricts the penetration of the actinic radiation curingly effective for the first resin component, it is advantageous to utilize the second mode of practicing the invention, as described below.

In the second mode of practicing the invention, the self-leveling liquid composition of the invention is formed by separate and discrete potting layers, comprising a lower resin layer comprising the second resin component but not the first resin component, and an overlying resin layer comprising the first resin component.

Thus, a first portion of the self-leveling liquid potting composition, comprising the second resin component but not the first resin component, is initially dispensed to form the lower portion of the final potting mass, and is filled into the housing up to about 120 mils or less from the desired top surface of the final potting mass. The second portion of the self-leveling liquid potting composition, comprising the first resin component, then is dispensed to form a separate and discrete layer on top of the previously dispensed resin layer, to complete the potting mass to the required overall depth of the potting composition.

Subsequent to the dispensing of the respective resin layers, the top layer comprising the first resin component is subjected to actinic radiation curing effective therefor. The result is a top resin layer comprising the fully cured first resin component, overlying an uncured lower layer comprising the second resin component. The second resin component then is suitably cured by the provision of curing conditions effective therefor.

In a particularly preferred embodiment, the first resin component in the dual-layer system is a (meth)acrylic resin curable by UV radiation, and the second resin component is a room temperature curing epoxy, e.g., an epoxy resin having a cure time at ambient (room temperature) conditions of about 2 to 24 hours.

The practice of the invention with the formation and curing of separate and discrete contiguous resin layers is, as indicated, useful where the depth of the potting mass is greater than about 120 mils in the housing.

Such dual-layer formation of the potting mass in the housing has a further advantage associated with the fact that many actinic radiation curable resin components have a significantly greater cost than resins curable by other methods. As an example, in the case of UV-curable acrylic resins and room temperature curing epoxy resins, the cost ratio may be on the order of about 10, i.e., the cost on a unit volume basis of the acrylic resin is about 10 times that of the room temperature curing epoxy material. Accordingly, the dual-layer potting mass, in which the upper layer comprising the first resin component layer is generally less than 120 mils in thickness, provides a significant cost savings relative to homogeneous mixtures of the respective first and second resin components, in addition to overcoming the actinic radiation cure problems incident to increased depths of resin, above about 120 mils, as previously described.

Further, it has been surprisingly and unexpectedly discovered that the bonding between the respective resin layers in the dual-layer mode of practicing the invention is excellent, and does not result in delamination or separation of the respective layers after curing, even under intensive thermal cycling conditions, when the upper layer comprises both the first and second resin components, and the lower layer comprises the second resin component but does not contain any first resin component.

It will be apparent from the foregoing discussion of the dual-layer mode of practicing the invention that the separate and discrete character of the respective resin layers must be continually maintained from the initial dispensing of these layers through their respective final cures. Accordingly, it is generally desirable to utilize a layer comprising the first resin component in such systems having a significantly lower specific gravity than the underlying resin layer comprising the second resin component but not the first resin component, so that the first resin component-containing layer "floats" on the underlying layer, and/or to provide the underlying resin layer of a formulation having sufficient viscosity so that the separate and discrete characters of the respective layers is maintained.

The invention may for example be advantageously practiced with a room temperature curing epoxy resin and a UV-curable acrylic resin in an upper layer having a specific gravity in the range of from about 1.0–1.2, in combination with a separate and discrete lower layer containing a room temperature curing epoxy and having a specific gravity in the range of from about 1.4–1.7.

In general, in the formation of separate and discrete layers containing the respective first and second resin components, it is desirable that the upper layer comprising the actinic radiation curable first resin component have a specific gravity which is from about 5 to about 95 percent of the specific gravity of the underlying layer comprising the second resin component but not the first resin component, more preferably from about 15 to about 90 percent, and most preferably from about 20 to about 85 percent.

If the respective upper and lower resin layers are closely similar in specific gravity characteristics, e.g., within about 5 to 10 percent of one another, it may be desirable to provide the lower layer in the form of a flowable gel or other high viscosity liquid formulation, so that the upper resin layer, of a suitably lower viscosity, is maintained on the surface of the previously dispensed lower layer. For example, it may be useful to employ as the first resin component in the upper layer a UV-curable acrylic resin, in combination with a room temperature curing epoxy second resin component, with the upper layer having a viscosity on the order of about 4000 centipoise, and with a separate and discrete underlying layer containing the room temperature curing epoxy second resin component, wherein the lower layer has a viscosity of about 80,000 centipoise.

It will be recognized that in instances of the dual-layer practice of the invention, it may be desirable or necessary to utilize various additives with the respective resin components, to adjust relative specific gravity and viscosity values to facilitate the maintenance of separate and discrete layers comprising the respective resin components. For example, it may be desirable in a given instance to increase the specific gravity and/or viscosity of the lower layer comprising the second resin component but not the first resin component, by addition to the lower resin layer formulation of filler materials, such as for example calcium carbonate, calcium sulfate, clay, talc, or any other suitable materials providing the desired characteristics.

The dual-layer practice of the invention, in which the first and second resin components are utilized to form contiguous separate and discrete resin layers, provides the same advantage as homogeneous blends of the first and second resin components, in quickly immobilizing the potting mass.

Thus, both the provision of the potting mass as a homogeneous mixture of the first and second resin components, and the provision of a potting mass comprising separate and discrete layers formed from such first and second resin components, overcome the prior art problems of void formation and migration of the potting mass, in a highly efficient and effective manner.

It will be appreciated that in lieu of the formation of two contiguous separate and discrete resin layers as previously described, it may in some instances be desirable to form the potting mass with more than two separate and discrete resin layers, and that all such multilayer potting masses and associated compositions are fully within the purview of the present invention.

BRIEF DESCRIPTION OF DRAWINGS

FIG. 3a is a partially sectioned elevational view of a solenoidal electronic fuel sensor, in which the solenoidal element may be potted in accordance with the invention;

FIG. 3b is the corresponding unsectioned end view of the same device.

FIGS. 4a, b, and c are views of an electrical switch suitable for use as a printed circuit board component, FIG. 4a showing a top plan view of the device, FIG. 4b showing a corresponding side view, and FIG. 4c being a close-up magnified view of a portion of the device as shown in FIG. 4b, illustrating the cured mass of the potting composition.

Referring now to the drawings, as showing various illustrative types of devices with which the invention may advantageously be employed, FIG. 1 depicts a variable resistance-type potentiometer with a multi-turn adjustment shaft.

Figure 1:
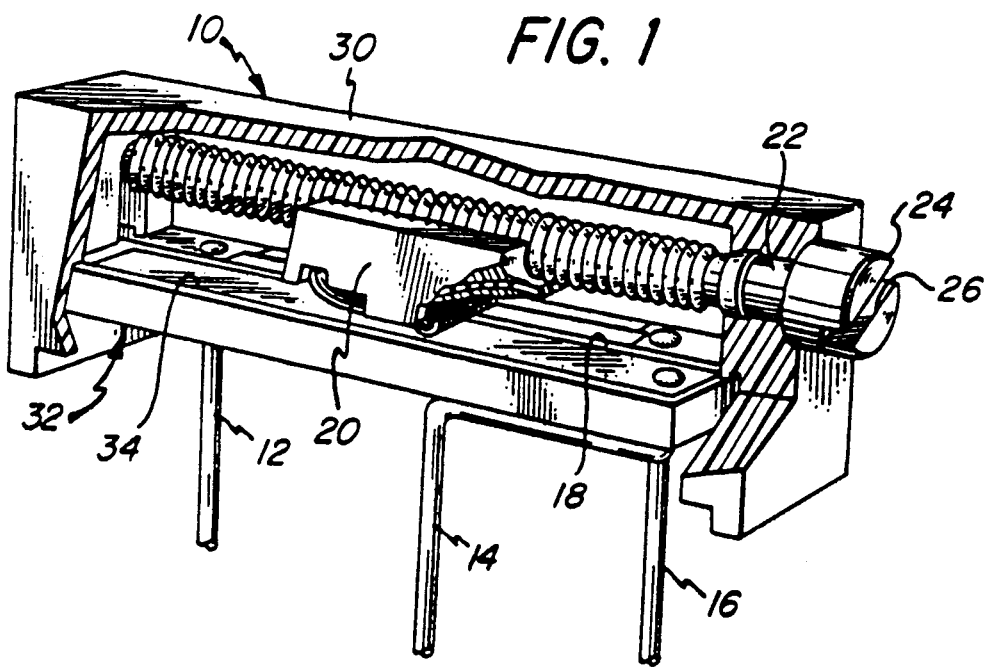
FIG. 1 is a perspective view, shown in cut-away section, of a variable-resistance type potentiometer featuring a multiturn adjustment shaft, which may be usefully potted in accordance with the invention.

The illustrated device 10 is a trimming potentiometer, an electromechanical device with three terminals, 12, 14, and 16. The two terminals 12 and 16 are connected to the ends of a resistive element 18, and the terminal 14 is connected to the movable conductive contact 20 which slides over the element, thus allowing the input voltage to be divided as a function of the mechanical input. The mechanical input is determined by the position of the adjustment shaft 22, of screw-like configuration, having an enlarged end face 24 with adjustment slot 26 therein for rotation of the shaft to the predetermined desired extent. Such adjustment will vary the electrical resistance characteristic of the device over a wide range, depending on the extent of adjustment, e.g., from 10 to 2,000,000 ohms.

The mechanism of the device, comprising resistive element 18 and movable contact 20, is interiorly disposed in a housing 30, whose bottom face 32 is open as shown and which with the associated resistive element 18 defines a recess 34 in the device, into which the potting composition of the invention is dispensed. It will be appreciated that for such dispensing operation, the device will be appropriately positioned in an inverted fashion relative to the position shown in FIG. 1.

Figure 2:
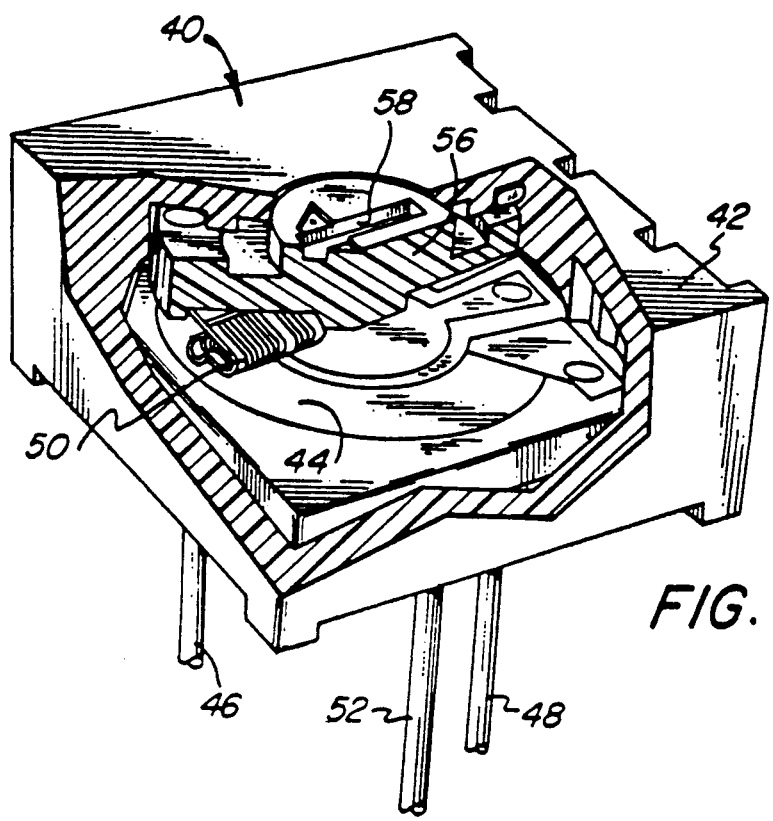
FIG. 2 is a perspective view of another variable-resistance type potentiometer with a single turn adjustment element, suitable for the practice of the invention, partially cut away to show the details of its construction.

FIG. 2 shows a variable resistance-type potentiometer device 40 comprising a housing 42 in which the resistance mechanism is disposed. The mechanism includes a resistive element, to which the terminals 46 and 48 are joined. The movable conductive contact 50 is joined to the third terminal 52, and positioned as desired by the slotted cylindrical head 56 having adjustment slot 58 therein.

As in the case of the FIG. 1 device, the device shown in FIG. 2 has at its bottom face a recess defined by the housing and the bottom surface of the movable contact into which the potting composition according to the invention may be dispensed and sequentially cured to provide a cured composition mass as a sealing barrier for the mechanism.

FIGS. 3a and 3b show, respectively, a partially sectioned side view and a corresponding unsectioned end view of an electronic fuel flow sensor assembly 62 comprising a housing 64 in which is disposed a solenoidal element 66. The view of FIG. 3a is along line 3a-3a of FIG. 3b.

The solenoidal element 66 is joined by suitable electronic coupling means to female connector elements 71 which permit the sensor assembly to be installed in an automotive electronic system for monitoring fuel flow. The sensor assembly comprises intake port 68 and outlet port 70 providing for fuel flow through the device.

In the housing of the sensor assembly there is an interior space 72 surrounding the solenoidal element 66 and its associated electronic coupling means, to which the potting composition of the invention may be introduced and sequentially cured as previously described.

FIG. 4a shows a printed circuit board switch 80 associated with a printed circuit board 82. The switch assembly features a manually actuatable switching member 84 mounted on housing 86 which by manual rotation is set to a predetermined position for operation of the printed circuit board.

As best shown in FIG. 4b, a corresponding side view of the switch (with the printed circuit board omitted for clarity), the switching member 84 is joined via shaft 88 to the interiorly disposed mechanism in the housing 86 (not shown). The internal mechanism in turn is joined to the terminals 90, which are soldered or otherwise connected to the circuitry of the printed circuit board.

FIG. 4c is an enlarged cut-away view of a portion of the device shown in FIG. 4b. As shown, the terminal 90 is joined to the interior mechanism 94, which with the housing 86 defines a recess in which a cured composition mass 92 has been potted according to the invention. The thickness t of the potting mass may suitably be on the order of 22 mils.

Figure 5:
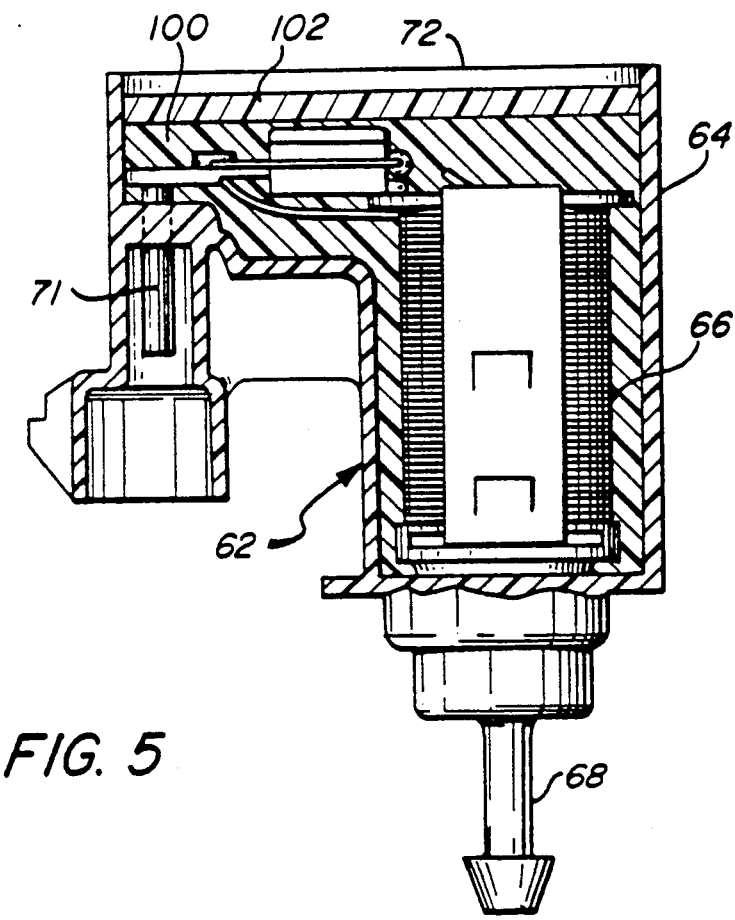
FIG. 5 is a partially sectioned elevation view of a solenoidal electronic fuel sensor of a type as shown in FIG. 3a, featuring a two-layer potting mass according to one embodiment of the invention.

FIG. 5 is a partially sectioned side view of an electronic fuel flow sensor assembly of the type previously described with reference to FIG. 3a (the same reference numbers as utilized in FIG. 3a being employed in FIG. 5), with a potting mass in the interior space 72 comprising a lower resin layer 100 and an upper resin layer 102.

The lower resin layer 100 may suitably be formed from a composition comprising a room temperature curing epoxy resin, as initially dispensed into the housing 64 to fill the housing to a depth to within 100 mils of the desired final top surface of the potting mass. The lower layer material may for example have a viscosity of 80,000 centipoise and a specific gravity of 1.4, as initially dispensed, with a curing time at room temperature conditions on the order of about 2 hours. Subsequent to dispensing of the epoxy resin-containing composition to form the lower layer 100, the upper layer 102 is formed by dispensing into the housing onto the previously dispensed lower resin layer a composition comprising an acrylic resin which is UV curable, in combination with the same type room temperature curing epoxy resin used in the lower layer. Such upper layer may have a viscosity of about 4,000 centipoise and a specific gravity of about 1.0. The depth of the upper resin layer 102 is 100 mils.

Subsequent to the dispensing of the acrylic/epoxy resin formulation to form the upper layer 102, the potting mass is subjected to suitable UV radiation which is curingly effective for the acrylic resin. There is formed, as a result of such curing radiation exposure, an upper cured layer overlying the uncured lower resin layer comprising the room temperature curing epoxy resin. At this point, the flow sensor assembly is fully handleable, and may be packaged, transported, installed, etc., without adverse effect, as the epoxy layer progressively cures under ambient conditions.

The features and advantages of the invention are further illustrated with respect to the following non-limiting examples, wherein all parts and percentages are by weight unless otherwise expressly stated.

EXAMPLE I

In this example, the formulation shown in Table I below was employed as a potting composition for a variable resistance-type potentiometer as illustrated in FIG. 1.

The potentiometer was a Model 3006 Industrial Cermet Trimpot potentiometer, commercially available from Bourns, Inc. (Riverside, CA) and had a housing of Valox polybutylene terephthalate.

TABLE I

| Component | Concentration, % |
| --- | --- |
| Part A | |
| diglycidyl ether bisphenol A (Dow DER 331) | 78.13 |
| ethoxylated trimethylol triacrylate (Ware Chemical Chemlink 176) | 18.75 |
| diethoxyacetophenone | 3.12 |
| Part B | |
| polyoxypropyleneamine (Texaco Jeffamine D230) | 96.15 |
| 2,4,6-tris(dimethylaminomethyl)phenol | 3.85 |

4.2 grams of Part A was mixed with 1 gram of Part B to form the potting composition. The composition then was dispensed into the cavity of the potentiometer housing while the potentiometer was positioned in inverted relationship to the position shown in FIG. 1.

The dispensed composition was immediately cured by exposure to ultraviolet radiation having a wavelength of 360 nanometers at a flux (intensity) of 100,000 microwatts/square centimeter for 5 seconds followed by heating of the potted device at 250 degrees F. for 15 minutes.

The potentiometer with the fully cured potting composition was evaluated by thermal cycling from −60 degrees C. to 125 degrees C. for 10 cycles. No delamination or cracking of the potting composition cured mass was observed, indicating that the composition had excellent thermal integrity.

The potting layer then was removed from the device using a rotary diamond saw. Visual inspection revealed that no migration of the potting composition onto the cermet resistor (corresponding to element 18 in FIG. 1) had occurred during the curing of the composition. This non-migratory behavior contrasted sharply with results experienced using single component heat cure epoxy compositions for potting of such potentiometers.

The non-migratory behavior of the potting composition of the invention permits the adjustment shaft to be assembled by insertion into the housing of the potentiometer device and coupling to the movable contact after the device has been potted, without concern that translation of the potting composition during its cure will foul the resistor mechanism or occlude the opening in the housing through which the adjustment shaft is to be inserted.

EXAMPLE II

This example employed as the potting composition the formulation shown in Table II below.

TABLE II

| Component | Concentration, % |
| --- | --- |
| Part A | |
| cycloaliphatic bisepoxide A (Cyanacure 6110) | 29.21 |
| cycloaliphatic bisepoxide B (Cyanacure 6351) | 48.69 |
| dipentaerythritol monohydroxy pentaacrylate | 18.50 |
| diethoxyacetophenone | 2.92 |
| organic air release agent (BYKA501) | 0.49 |
| PENNCO Black (Penn Color) | 0.19 |
| Part B | |
| liquid anhydride blend ACDP-1 (Anhydrides & Chemicals Co.) | 80.00 |
| dipentaerythritol monohydroxy pentaacrylate | 20.00 |

Equal weights of Parts A and B were mixed through static mixing elements and employed to pot a fuel flow sensor assembly of the type shown in FIGS. 3a and 3b, constructed of nylon. The device was filled to the top of the sensor and irradiated with UV light having a wavelength of 360 nanometers at an intensity of 100,000 microwatts per square centimeter for 5 seconds.

The housing then was filled completely and again irradiated under the same UV light conditions to immobilize the potting mass and render it impermeable to gas channeling void formation in the subsequent curing.

After a 24 hour room temperature post cure, the device was suitable for use in automobile engine construction. The assembled device was found to be resistant to extreme conditions of thermal shock, based on thermal cycling while under voltage simulative of operating conditions in use. The device also exhibited good vibration resistance and solvent resistance to gasoline.

No air bubbles were apparent at the surface of the cured potting mass. Sectioning of the device showed the interior of the potted mass to be free from any voids. These characteristics were in marked contrast to those observed in the use of single component heat cure epoxy formulations as potting compositions.

The potting composition of this example is particularly attractive from the standpoint of its ionic purity, convenient mix ratio, and its mixing ratio insensitivity (i.e., its ability to tolerate deviations from precise 1:1 mixing proportions).

EXAMPLE III

Equal weights of Parts A and B of the formulation shown in Table III were mixed through static mixing elements and used to pot a printed circuit board switch of the type described in connection with FIG. 4a, b, and c.

TABLE III

| Component | Concentration, % |
|---|---|
| Part A | |
| diglycidyl ether bisphenol A (Dow Quatrex 1010) | 75.3 |
| dipentaerythritol monohydroxy pentaacrylate | 21.0 |
| 1-benzoyl cyclohexanol | 3.0 |
| organic air release agent (BYKA501) | 0.5 |
| Pennco Blue Pigment (Penn Color) | 0.2 |
| Part B | |
| polyoxypropyleneamine (Texaco Jeffamine D230) | 22.73 |
| aluminum oxide | 68.18 |
| C17 aliphatic acrylate (Kayard R644) | 9.09 |

The potting composition was dispensed into the housing of the switch and immediately cured by exposure to UV radiation having a wavelength of 360 nanometers at an intensity of 100,000 microwatts per square centimeter for 5 seconds. The composition then was sufficiently immobilized for the device to be packaged and shipped to the end user.

Following room temperature post curing, a 75 Shore D hardness polymer results.

The potting layer was removed from the device using a rotary diamond saw. Visual inspection revealed that no migration of the composition onto the rotary switch mechanism in the housing had occurred.

The potting composition of this example is particularly advantageous due to its convenient mix ratio and the high thermal conductivity of the finally cured potting mass.

EXAMPLE IV

The formulation of Table IV was mixed in equal weights of Parts A and B through static mixing elements and employed to pot a potentiometer of the type shown in FIG. 2 and having a housing formed of Valox polybutylene terephthalate.

TABLE IV

| Component | Concentration, % |
|---|---|
| Part A | |
| diglycidyl ether bisphenol A (Dow Quatrex 1010) | 75.86 |
| dipentaerythritol monohydroxy pentaacrylate (Sartomer SR399) | 21.14 |
| 1-benzoyl cyclohexanol | 3.00 |
| Part B | |
| liquid anhydride (Archem ECA 250) | 77.68 |
| dipentaerythritol monohydroxy pentaacrylate | 19.42 |
| 2,4,6-tris(dimethylamino methyl)phenol | 3.00 |

Curing of the potting mass was by UV radiation exposure at a wavelength of 360 nanometers and intensity of 100,000 microwatts per square centimeter for 5 seconds followed by heating at 250 degrees F. for 15 minutes.

The fully cured potting layer was removed from the device using a rotary diamond saw, and revealed that no migration of the composition onto the internal resistance element had taken place.

The potentiometer employed in this example was a Model 3386 Cermet Element Bourns potentiometer, commercially available from Bourns, Inc. (Riverside, CA). As contrasted to the potentiometer employed in Example I, the potentiometer of this example was a sealed unit. In such sealed units, heat curing of the potting composition using conventional heat cured epoxy formulations frequently results in the formation of "blow holes" in the potted mass due to pressurization in the lower compartment of the device. In this example, however, no blow holes or porosity was observed.

The potting composition of this example has a significant advantage over the potting composition of Example I due to its extremely long pot life (Example I = 4 hours; Example IV = 72 hours), which minimizes equipment problems in the application of the potting composition of this example.

EXAMPLE V

Equal weights of Parts A and B shown in Table V below were mixed and utilized to pot a Model 3262 Cermet Element Bourns potentiometer (Bourns, Inc., Riverside, CA) having a housing formed of Valox polybutylene terephthalate.

TABLE V

| Component | Concentration, % |
|---|---|
| Part A | |
| diglycidyl ether bisphenol A (Dow DER 331) | 75.3 |
| dipentaerythritol monohydroxy pentaacrylate | 21.2 |
| 1-benzoyl cyclohexanol | 3.0 |
| BYK 501 | 5.0 |
| Part B | |
| polypropyleneamine (Texaco Jeffamine D230) | 22.8 |
| polypropyleneamine (Texaco Jeffamine 2000) | 20.0 |
| aluminum oxide | 49.12 |
| C14 aliphatic diacrylate | 8.00 |

Curing of the dispensed potting composition involved a first actinic radiation exposure of the composition to UV radiation having a wavelength of 360 nanometers at an intensity of 1000, 000 microwatts per square centimeter for 5 seconds followed by heating at 250 degrees F. for 15 minutes.

Subsequent sectioning of the device revealed no fouling of the electromechanical element or migration of the pottting composition onto the resistance element of the mechanism during cure of the composition.

The potting composition of this example is particularly advantageous as compared with the compositions of the preceding examples, due to its low modulus and durometer characteristics. Such characteristics are highly desirable when the device to be potted contains fragile mechanism elements.

EXAMPLE VI

A potentiometer of the same type utilized in Example I was potted with the composition described in Table VI.

TABLE VI

| Component | Concentration, % |
| --- | --- |
| diglycidyl ether bisphenol A (Dow Quatrex 1010) | 67.06 |
| ethoxylated trimethylol triacrylate (Ware Chemlink 176) | 18.78 |
| diethoxyacetophenone | 2.68 |
| boron trichloride amine salt (CIBA XU213) | 5.36 |
| epoxidized CTB (Spencer Kellogg XP5515) | 5.36 |
| free radical stabilizer (Loctite PM12) | 0.27 |
| free radical stabilizer (Loctite PM31) | 0.35 |
| blue pigment (Hoechst Reflex Blue R-51) | 0.13 |

The curing schedule for the potted composition included exposure to UV radiation having a wavelength of 360 nanometers at an intensity of 100,000 microwatts per square centimeter for 10 seconds followed by heating at 300 degrees F. for 10 minutes.

The device potted with this single parr composition was visually inspected after curing of the potting mass. No blow holes or migration problems were observed, contrary to the case with conventional single part heat cure epoxy compositions.

EXAMPLE VII

The composition shown in Table VII is suitable for shallow potting of devices in accordance with the invention, where rapid heat cure without migration is required.

TABLE VII

| Component | Concentration, % |
| --- | --- |
| diglycidyl ether bisphenol A (Dow Quatrex 1010) | 31.26 |
| latent amine hardener (Ciba Geigy HY940) | 52.00 |
| ethoxylated trimethyloltriacrylate (Ware Chemlink 176) | 14.54 |
| diethoxyacetophenone | 2.00 |
| free radical stabilizer (Loctite PM12) | 0.10 |
| free radical stabilizer (Loctite PM31) | 0.10 |

The curing schedule for this potting composition comprises exposure of UV radiation having a wavelength of 360 nanomethers at an intensity of 100,000 microwatts per square centimeter for 10 seconds followed by heating at 300 degrees F. for 2 minutes. Under such conditions, UV cure and immobilization of the composition will occur to a depth of 10 mils. This composition is particularly advantageous because of its rapid thermal cure response.

EXAMPLE VIII

The potting composition shown in Table VIII may suitably be cured at UV radiation conditions of radiation wavelength = 360 nanometers, and radiation intensity = 100,000 microwatts per square centimeter for 30 seconds, followed by heating at 300 degrees F. for 1 hour.

TABLE VIII

| Component | Concentration, % |
| --- | --- |
| cycloaliphatic bisepoxide A (Union Carbide 6351) | 29.08 |
| cycloaliphatic bisepoxide B (Union Carbide 6110) | 18.88 |
| cationic photoinitiator (Union Carbide 6974) | 1.02 |
| diglycidyl ether bisphenol A (Dow Quatrex 1010) | 28.57 |
| himic anhydride | 22.45 |

A hard high temperature resistant polymer (greater than 75 Shore D hardness, stable up to 350 degrees F. continuous exposure) results.

This composition contains only epoxy ingredients as the respective first and second resin components, and provides a cured composition mass with a high heat distortion temperature. UV immobilization is by cationic polymerization rather than free radical polymerization as in the preceding examples.

EXAMPLE IX

Equal weights of Parts A and B of the formulation shown in Table IX were mixed and cured by UV radiation having a wavelength of 360 nanometers and intensity of 100,000 microwatts per square centimeter, followed by 24 hour post cure at room temperature.

TABLE IX

| Component | Concentration, % |
| --- | --- |
| Part A | |
| aromatic isocyanate prepolymer (Casschem Inc. Vorite P689) | 100 |
| Part B | |
| polyol (Casschem Inc. Poly P640) | 80 |
| dipentaerythritol monohydroxy pentaacrylate (Sartomer SR399) | 18 |
| diethoxyacetophenone | 2 |

Such curing of the composition produces UV immobilization in the actinic radiation exposure step to a depth in the potted mass of at least 100 mils.

The composition of this example when fully cured provides a flexible sealant composition mass. Urethane based compositions of this type are particularly useful where a low Shore D or Shore A hardness potting material is desired.

EXAMPLE X

Another urethane-based potting composition was prepared using the formulation shown in Table X.

TABLE X

| Component | Concentration, % |
| --- | --- |
| Part A | |
| diisocyanate prepolymer (Spencer Kellogg XP5270) | 90 |
| dipentaerythritol monohydroxy pentaacrylate (Sartomer SR399) | 10 |
| Part B | |
| mixed polyester polyols (Spencer Kellogg XP5430) | 90 |
| dipentaerythritol monohydroxy pentaacrylate (Sartomer SR 399) | 8 |
| diethoxyacetophenone | 2 |

Equal weights of Parts A and B were mixed and cured by actinic UV radiation having a wavelength of 360 nanometers at an intensity of 100,000 microwatts per square centimeter followed by 24 hour ambient post cure. This composition showed UV immobilization to a depth of at least 100 mils.

EXAMPLE XI

In contrast to the preceding examples, Example I-X, wherein the first and second resin components of the potting composition were homogeneously mixed with one another to form the self-leveling liquid utilized in the potting operation, the present example is directed to an illustrative embodiment of the invention wherein the potting mass is formed as comprising two separate and discrete resin layers contiguous to one another.

A lower layer resin formulation was made up having the composition shown in Table XI below.

TABLE XI

| Component | Concentration, % |
|---|---|
| Part A | |
| diglycidyl ether bisphenol A | 39.75 |
| fumed silica | 1.15 |
| iron oxide | 15 |
| barium sulfate | 20 |
| calcium carbonate | 21.92 |
| Epi-Rez SU3 polyfunctional epoxy resin (Interez Corp, Louisville, Kentucky) | 2.13 |
| Part B | |
| barium sulfate | 17.39 |
| aluminum silicate | 7.25 |
| calcium carbonate | 43.48 |
| Dow epoxy hardener DEH20 (Dow Chemical Company, Midland, Michigan) | 3.62 |
| Emerez 1612 polyamide epoxy (Emery Corporation, Cincinnati, Ohio) | 25.63 |
| titanium dioxide | 2.9 |

Parts A and B of the Table XI formulation were thoroughly mixed with one another to form a liquid resin composition having a specific gravity of 1.7. This resin and a pot life of two hours and a cure time to achieve full properties of 24 hours at 23° C.

This epoxy resin formulation was dispensed into the housing of a fuel flow sensor assembly of the type shown in FIG. 5, constructed of nylon and having an interior volume of 18 cubic centimeters. 18 grams of the formulation were dispensed to provide a first layer of the potted mass in the interior volume of the housing, whose upper surface was approximately 120 mils from the final desired top surface of the potting mass.

A resin composition comprising a UV-curable resin and a (non-UV cured) room temperature cure epoxy resin was prepared, of the formulation set forth in Table III of Example III. This composition, having a specific gravity of 1.2, was dispensed into the housing on top of the previously dispensed first resin layer to provide an additional depth of 100 mils to the overall potting mass.

The resulting two-layer potting mass was then exposed to UV radiation having a wavelength of 360 nanometers at an intensity of 100,000 microwatts per square centimeter for 5 seconds. The composition following such radiation exposure was sufficiently immobilized for the device to be packaged and shipped to an end user.

Following room temperature curing of the two-layer potting mass for 24 hours at ambient conditions, the flow sensor device was evaluated by thermal shock testing. thermal shock cycles between −50° C. and 120° C., being held at each of the temperature extremes for one hour prior to sudden exposure to the other temperature extreme for a like period.

Following thermal shock cycling, the sensor article was sectioned to evaluate the character of the interface between the respective resin layers, and the adhesion of the potted mass to the walls of the sensor device. It was suprisingly and unexpectedly discovered that there was no interlayer delamination between the respective layers, and no delamination of the potting mass at its juncture with the walls of the device to which the potting mass had adhered. In addition, no evidence of migration or gas channeling void formation was observed in the cured potting mass.

It is to be noted that the device in this example employed an upper layer in the potting mass comprising both UV curable and non-UV curable resin components. In some instances, it may be desirable to utilize only UV curable resin component(s) in the upper resin layer, and it is thus within the broad purview of the present invention to utilize both UV and non-UV curable resin components, or alternatively to use only one or more UV curable resins, in such upper layer.

Best Mode For Carrying Out The Invention

The best mode of practicing the present invention involves the use of a (meth)acrylic acid ester which is curable by actinic radiation as a first resin component, in combination with an epoxy resin as the second resin component. In instances where the depth required to be potted is less than the actinic radiation penetration distance, these resins are suitably homogeneously mixed with one another to form the potting resin composition. Examples I-VII herein illustrate the best mode practice of such homogeneous mixtures of acrylate and epoxy resins.

Where the depth of actinic radiation penetration is less than the depth of the interior volume of the device to be potted, the best mode of practicing the invention involves forming the cured mass of the potting composition with contiguous discrete and separate resin layers, with the upper layer containing the first resin component (the actinic radiation-curable component) and a second resin component which is non-cured under the actinic radiation conditions curingly effective for the first resin component, overlying a lower layer containing the second resin component but not the first resin component. Example XI illustrates this mode of carrying out the invention for a UV curable acrylic resin as the preferred first resin component and an ambient temperature cured epoxy resin as the second resin component.

In the two-layer mode of practicing the invention, the upper layer desirably contains the same second resin component as utilized in the lower resin layer of the potting mass, so that there is co-curing of the second resin components across the interface between the respective upper and lower layers, to provide good cohesion and continuity characteristics at such interface, so that delamination and morphological defects due to differential thermal expansion and contraction between the respective layers is minimized. In this respect, the coefficients of thermal expansion and contraction for the respective upper and lower layers are advantageously closely matched to provide optimal structural integrity and performance characteristics.

The best mode of practicing the invention in the two-layer form thereof involves the use of a (meth)acrylic acid ester as the first resin component, and an epoxy resin, preferably a room temperature curing epoxy resin, as the second resin component.

Industrial Applicability

The present invention has broad applicability to the production of electrical/mechanical devices such as variable resistance-type potentiometers, capacitors, printed circuit board switches, solenoids, resistors, fluid flow sensors, and the like, which are reliably and efficiently sealed against environmental contact with the internal elements thereof. Such devices potted in accordance with the present invention are free of the curingly caused migrative movement of the potting mass in the housing and fouling incident to the use of prior art single resin component potting compositions.

What is claimed is:

1. A device comprising a housing containing a mechanism potted therein by a cured mass of a self-leveling liquid composition;

the cured mass including a separate and discrete overlying layer comprising an actinic radiation cured first resin component, and an underlying layer comprising a second, ambient temperature curable resin component which is non-cured under actinic radiation conditions effective for curing the first resin component, and with the underlying layer not comprising the first resin component;

wherein the layers have been formed by providing in the housing a first portion of the self-leveling liquid components comprising a second resin component but not the first resin component, to form a first self-leveling liquid layer, and a second portion of the self-leveling liquid layer, and a second first component, to form a separate and discrete second self-leveling liquid layer on top of the first self-leveling liquid layer, and prior to curing of the second resin component, exposing the liquid composition to actinic radiation which is curingly effective for the first resin component, to form the overlying layer comprising the cured first resin component, above the uncured underlying layer comprising the second resin component, followed by curing of the second resin component.

2. A device according to claim 1, wherein the actinic radiation cured first resin component comprises a material selected from the group consisting of: (a) (meth)acrylic resins, (b) vinyl monomers, (c) unsaturated polyesters, solubilized in vinyl monomers, and (d) epoxy resins.

3. A device according to claim 1, wherein the actinic radiation cured first resin component comprises a (meth)acrylic acid ester.

4. A device according to claim 1, wherein the actinic radiation cured first resin component comprises a (meth)acrylic acid ester.

5. A device according to claim 1, wherein the cured second resin component is cured under ambient temperature curing conditions selected from one or more compatible conditions of the group consisting of: (a) moisture exposure, (b) reaction with curative species, (c) in situ formation of curative species, and (d) actinic radiation exposure differing from the actinic radiation exposure which is curingly effective for the first resin component.

6. A device according to claim 1, wherein the second resin component comprises a material selected from the group consisting of epoxy resins, silicones, and urethanes.

7. An electronic liquid flow sensor according to claim 1.

8. A printed circuit board element according to claim 1.

9. A printed circuit board comprising an element according to claim 1.

10. A potentiometer according to claim 1.

11. A device according to claim 1, wherein the thickness of the cured composition mass is greater than about 40 mils.

12. A device according to claim 1, wherein the thickness of the cured composition mass is greater than about 60 mils.

13. A device according to claim 1, wherein the second resin component comprises an epoxy resin, and the housing is formed of a material selected from the group consisting of polybutylene teraphthalate and polyphenylene sulfide.

14. A device according to claim 1, wherein the housing has an opening therein through which a structural element is extended and joined to the potted mechanism in the housing.

15. A device according to claim 1, wherein the concentration of the first resin component in the composition is from about 1 to about 50 percent by weight, based on the total weight of the first and second resin components in the composition.

16. A device according to claim 1, wherein the concentration of the first resin component in the composition is from about 1 to about 30 percent by weight, based on the total weight of the first and second resin components in the composition.

17. A device according to claim 1, wherein the concentration of the first resin component in the composition is from about 5 to about 20 percent by weight, based on the total weight of the first and second resin component in the composition.

18. A device according to claim 1, wherein the concentration of the first resin component in the composition is from about 5 to about 10 percent by weight, based on the total weight of the first and second resin components in the composition.

19. A device according to claim 1, wherein the specific gravity of said layer comprising said first resin component prior to its curing is from about 5 to about 95 percent of the specific gravity of the underlying layer comprising said second resin component.

20. A device according to claim 3, wherein said second resin component comprises an ambient temperature cure epoxy resin.

21. A device according to claim 1, wherein the underlying layer comprises an inert filler.

22. A device according to claim 1, wherein the thickness of the layer comprising the first resin component does not exceed about 120 mils.

23. A device comprising a housing containing a mechanism potted therein by a dual layer cured mass of a self-leveling liquid composition comprising an actinic radiation cured first resin component in an upper layer which is initially cured, and a non-actinic radiation curable second resin component in a lower layer which is subsequently cured at ambient temperature conditions, wherein the thickness of the cured mass is at least 40 mils.

24. A device according to claim 23, wherein the self-leveling liquid component contains the first and second resin components in sufficient amounts, viscosities, and specific gravities relative to one another as to cause said composition prior to curing thereof to separate into an overlying layer comprising the first resin component and an underlying layer comprising the second resin component.

25. A device comprising a housing containing a mechanism therein in a partially cured potting mass formed from a self-leveling composition, and comprising a cured overlying solid layer comprising an actinic radiation cured first resin component, and an underlying uncured liquid layer comprising an ambient temperature curable second resin component which is non-curable under actinic radiation conditions effective for curing the first resin component.

26. A device according to claim 25, wherein the actinic radiation cured first resin component comprises a material selected from the group consisting of: (a) (meth)acrylic resins, (b) vinyl monomers, (c) unsaturated polyesters, solubilized in vinyl monomers, and (d) epoxy resins.

27. A device according to claim 25, wherein the actinic radiation cured first resin component comprises a (meth)acrylic acid ester.

28. A device according to claim 25, wherein the second resin component is curable under ambient temperature conditions selected from one or more compatible conditions of the group consisting of: (a) moisture exposure, (b) reaction with curative species, (c) in situ formation of curative species, and (d) actinic radiation exposure differing from the actinic radiation exposure which is curingly effective for the first resin component.

29. A device according to claim 25, wherein the second resin component comprises a material selected from the group consisting of epoxy resins, silicones, and urethanes.

30. A device according to claim 25, wherein said second resin component comprises an ambient temperature cure epoxy resin.

31. A device according to claim 25, wherein the thickness of the cured overlying layer comprising the actinic radiation cured first resin component does not exceed about 120 mils.

32. A device according to claim 25, comprising an electronic liquid flow sensor.

33. A device according to claim 25, comprising a printed circuit board.

34. A printed circuit board comprising a device according to claim 25.

35. A device according to claim 25, comprising a potentiometer.

36. A device according to claim 25, wherein the thickness of the partially cured potting mass is greater than about 40 mils.

37. A device according to claim 25, wherein the thickness of the partially cured potting mass is greater than about 60 mils.

38. A device comprising a housing containing a mechanism potted therein by a cured mass of a self-leveling liquid composition comprising upper and lower layers, wherein the upper layer comprises a UV-curable acrylic resin and a room temperature curing epoxy resin, with the upper layer having a specific gravity in the range of from about 1.0 to 1.2, and a separate and discrete lower layer containing a room temperature curing epoxy and having a specific gravity in the range of from about 1.4 to 1.7.

* * * * *

UNITED STATES PATENT AND TRADEMARK OFFICE
CERTIFICATE OF CORRECTION

PATENT NO. : 5,057,348

DATED : October 15, 1991

INVENTOR(S) : Kieran F. Drain & Larry A. Nativi

It is certified that error appears in the above-identified patent and that said Letters Patent is hereby corrected as shown below:

```
On the Title page
    Abstract, line 6, after"(102)," insert --,--.
    Abstract, line 6, change "(methacrylate)" to --(meth)acrylate--.
    Abstract, line 6, change "resins" to --resin(s)--.
    Abstract, line 8, change "resins" to --resin(s)--.
    Abstract, line 9, after "radiation", insert --exposure--.
    Abstract, line 16, after "as", insert --a--.

Column 1, line 12, change "applicaation" to --application--.
    Column 2, line 47, change "9,856" to --99,856--.
    Column 11, line 37, change "resln" to --resin--.
    Column 18, line 56, change "pottting" to --potting--.
```

Signed and Sealed this

Twenty-third Day of February, 1993

*Attest:*

STEPHEN G. KUNIN

*Attesting Officer*     Acting Commissioner of Patents and Trademarks